(12) United States Patent
Avenas

(10) Patent No.: US 11,823,971 B2
(45) Date of Patent: Nov. 21, 2023

(54) POWER ELECTRONICS SYSTEM

(71) Applicant: INSTITUT POLYTECHNIQUE DE GRENOBLE, Grenoble (FR)

(72) Inventor: Yvan Avenas, Montbonnot Saint Martin (FR)

(73) Assignee: INSTITUT POLYTECHNIQUE DE GRENOBLE, Grenoble (FR)

(*) Notice: Subject to any disclaimer, the term of this patent is extended or adjusted under 35 U.S.C. 154(b) by 412 days.

(21) Appl. No.: 17/291,521

(22) PCT Filed: Nov. 5, 2019

(86) PCT No.: PCT/EP2019/080280
§ 371 (c)(1),
(2) Date: May 5, 2021

(87) PCT Pub. No.: WO2020/094663
PCT Pub. Date: May 14, 2020

(65) Prior Publication Data
US 2022/0077021 A1    Mar. 10, 2022

(30) Foreign Application Priority Data
Nov. 6, 2018    (FR) ........................................ 1860229

(51) Int. Cl.
*H02M 1/32* (2007.01)
*H01L 23/36* (2006.01)
*H02M 3/00* (2006.01)
*H01L 23/538* (2006.01)

(52) U.S. Cl.
CPC .......... *H01L 23/36* (2013.01); *H01L 23/5389* (2013.01); *H02M 1/327* (2021.05); *H02M 3/003* (2021.05)

(58) Field of Classification Search
CPC .... H01L 23/26; H01L 23/5389; H02M 1/327; H02M 3/003
See application file for complete search history.

(56) References Cited

U.S. PATENT DOCUMENTS

| | | | |
|---|---|---|---|
| 5,424,919 A | 6/1995 | Hielbronner | |
| 8,766,433 B2* | 7/2014 | Avenas | ................... H01L 23/46 257/713 |
| 9,693,480 B2* | 6/2017 | Salat | ...................... H01L 23/473 |
| 2015/0179611 A1 | 6/2015 | Lu et al. | |

FOREIGN PATENT DOCUMENTS

WO    2018189468 A1    10/2018

OTHER PUBLICATIONS

International Search Report and Written Opinion issued in corresponding International Application No. PCT/EP2019/080280, dated Feb. 3, 2020, pp. 1-7, European Patent Office, Rijswijk, Netherlands.

* cited by examiner

*Primary Examiner* — Adolf D Berhane
(74) *Attorney, Agent, or Firm* — HAUPTMAN HAM, LLP

(57) ABSTRACT

The disclosure relates to an electronic system including a plurality of adjacent, elementary power electronics modules and connected to one another by an electrical module connection. Each elementary module including at least one power component integrated on a printed circuit inserted between two electrically conductive heat sinks. The electrical module connection is made by heat sinks at the side and/or central connection surfaces thereof.

13 Claims, 10 Drawing Sheets

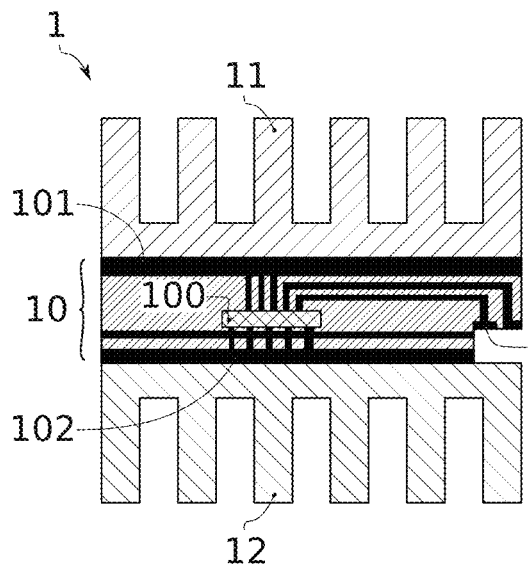
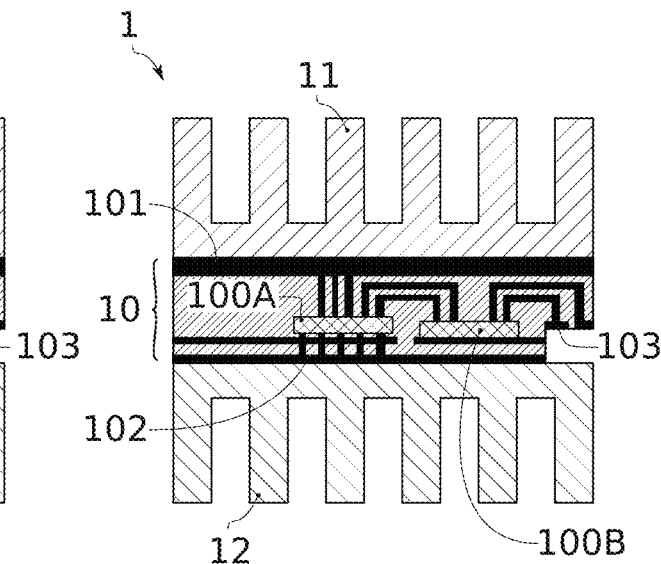
FIG. 7A   FIG. 7B
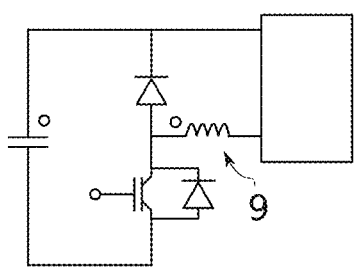
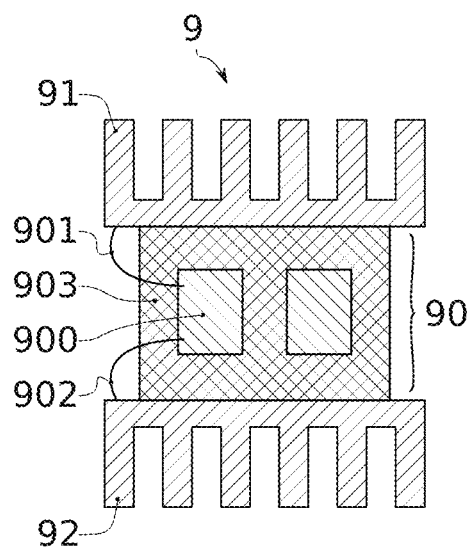
FIG. 8A   FIG. 8B

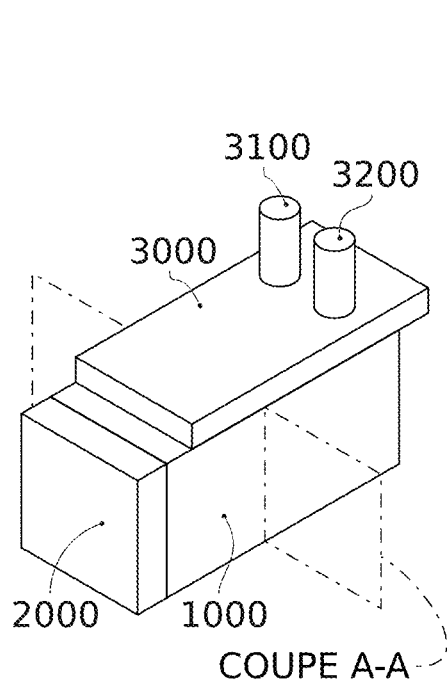
FIG. 11A
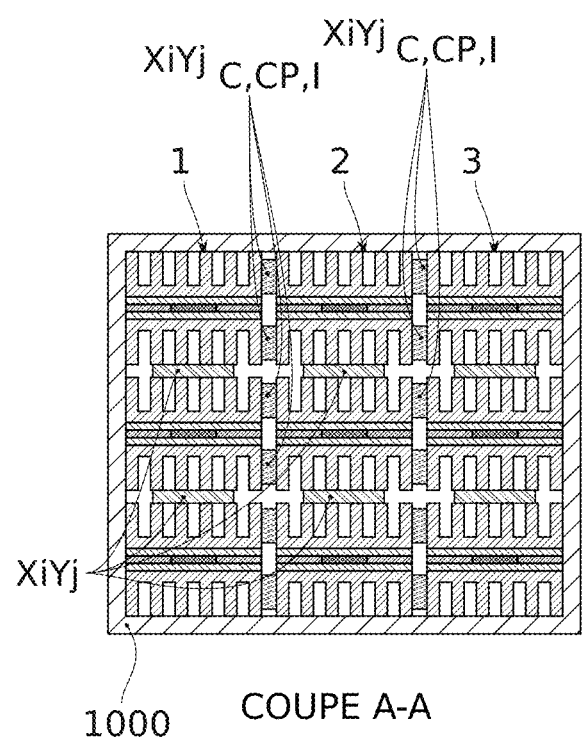
COUPE A-A
FIG. 11B
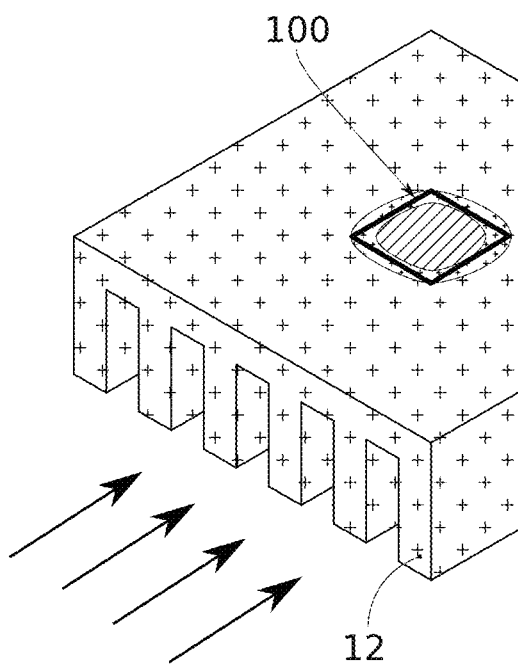
FIG. 12
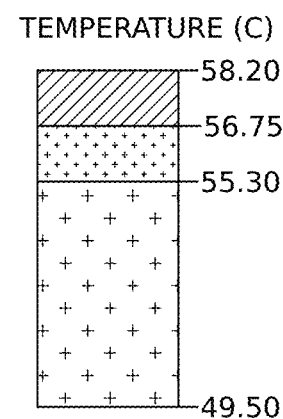

POWER ELECTRONICS SYSTEM

The present application is a U.S. National Phase of International Application Number PCT/EP2019/080280, filed Nov. 5, 2019, which claims priority to French Application No. 1860229, filed Nov. 6, 2018.

TECHNICAL FIELD OF THE INVENTION

The invention relates to power electronics systems. It finds at least one particularly advantageous application in the field of static power converters.

PRIOR ART

An electronic power converter generally comprises elementary power modules connected to each other.

Each elementary power module comprises power components, such as transistors (for example Insulated Gate Bipolar Transistors IGBT) and diodes, assembled in the form of a chip in order to ensure an elementary function, for example an electronic switch function.

The heat produced by the power components of the elementary power modules must be dissipated.

The elementary power modules are generally transferred to a cooling or heat sink system.

An air cooling system comprising, for example, metal fins welded onto an aluminium base transferred on the rear face of the chip carrier is a standard solution in power electronics.

However, the efficiency of such a system is not optimal. Its size and mass are relatively large.

Another solution consists in using a liquid cooling system in order to improve heat exchange between the power module and the surrounding fluid.

However, such a system requires hydraulic circuits resulting in a higher cost than the air cooling system, and more complex maintenance.

Another solution consists in cooling the two faces of the component within the power module.

The power component is then inserted between a first heat sink facing its first face, and a second heat sink facing its second face, opposite the first face, as illustrated in FIG. 1.

The first heat sink may further be connected to a first electrode, for example the anode, of the power component, so as to provide a first electrical connection, for example anode connection, to the power component.

The second heat sink can also be connected to a second electrode, for example the cathode, of the power component, so as to ensure a second electrical connection, for example cathode connection, to the power component.

This solution advantageously allows to functionalise the heat sinks of the power module. It is therefore possible to assemble several power modules in a configuration called "press-pack" configuration, in the form of a stack of said power modules, in order to produce electronic cells comprising at least two power modules interconnected by means of their heat sinks.

However, such an assembly requires exerting a very high external pressure in order to limit the thermal resistance of contact between the heat sinks and the ceramic casing of the interconnected power modules.

This type of "press-pack" assembly therefore comprises a press or a pressure device around the power modules.

This pressure device is generally bulky.

Therefore, a "press-pack" assembly allows to place two power modules in series, but is not adapted for placing power modules in parallel.

This assembly also induces large parasitic inductances which are not very compatible with the use of electronic cells comprising fast switching power components.

An object of the present invention is to at least partially overcome some of the disadvantages mentioned above.

According to a particular aspect, an object of the present invention is to provide an electronic system comprising power modules in parallel and/or in series having a simple and efficient cooling system.

Another object of the present invention is to provide an electronic system comprising an assembly of power modules limiting parasitic inductances.

The other objects, features and advantages of the present invention will become apparent upon examining the following description and the accompanying drawings. It is understood that other advantages can be incorporated.

SUMMARY

To achieve this purpose, a first aspect relates to an electronic system comprising at least one electronic cell, said at least one electronic cell comprising:
  A first elementary power electronic module, called first elementary module,
  A second elementary power electronic module, called second elementary module,
  Said first and second elementary modules being adjacent and connected to each other.

Each of these first and second elementary modules comprises:
  at least one power component, preferably integrated on or in a printed circuit,
  a first electrically conductive heat sink, called anode heatsink, connected to a first electrode called anode of the power component, and
  a second electrically conductive heat sink, called cathode heatsink, connected to a second electrode, called cathode of the power component.

Advantageously, the cathode heatsinks each have a first connection surface called central cathode surface and at least one second connection surface called cathode side surface.

Furthermore, the anode heatsinks each have a first connection surface called central anode surface and at least one second connection surface called anode side surface.

Advantageously, the connection of the first and second adjacent elementary modules comprises at least one side conductive electrical connection between:
  at least one of the anode and cathode side surfaces of the first elementary module, and
  at least one of the anode and cathode side surfaces of the second elementary module.

According to the invention and particularly advantageously, the power modules can be connected laterally by the side connection surfaces of their heat sinks.

This first configuration allows to simply connect power modules in parallel or in anti-parallel.

This first configuration also allows to connect power modules in series, for example by a 180° turn of one of the power modules to be connected.

The power modules can further be connected vertically by means of the central connection surfaces of their heat sinks.

This second configuration allows to simply connect power modules in series.

This second configuration also allows to connect power modules in parallel or anti-parallel, for example by a 180° turn of one of the power modules to be connected.

Such an electronic system comprising electronic modules connected according to the first and/or second aforementioned configurations advantageously allows to produce various structures in the field of power electronics, such as switching cells, choppers, or inverters, possibly with multilevel or interlaced configurations.

Each elementary power module being equipped with two heat sinks, the overall cooling efficiency of the electronic system is improved.

BRIEF DESCRIPTION OF THE FIGURES

The purposes, objects, as well as the features and advantages of the invention will become more apparent from the detailed description of embodiments of the latter which are illustrated by the following accompanying drawings wherein:

FIG. 7A shows a physical embodiment diagram of an elementary power electronic module according to an embodiment of the present invention;

FIG. 7B shows a physical embodiment diagram of an elementary power electronic module according to another embodiment of the present invention;

FIG. 8A shows an electronic diagram of a switching cell coupled to a load by means of an inductor;

FIG. 8B shows a physical embodiment diagram of the inductor illustrated in FIG. 8A according to an embodiment of the present invention;

FIG. 11A shows a physical embodiment diagram of an electronic system according to an embodiment of the present invention;

FIG. 11B shows a physical embodiment diagram in transverse section along the plane A-A indicated in FIG. 11A of the electronic system according to the embodiment of the present invention illustrated in FIG. 11A;

FIG. 12 illustrates a thermal simulation result carried out on an elementary power electronic half-module according to one embodiment of the present invention.

Figure 1:
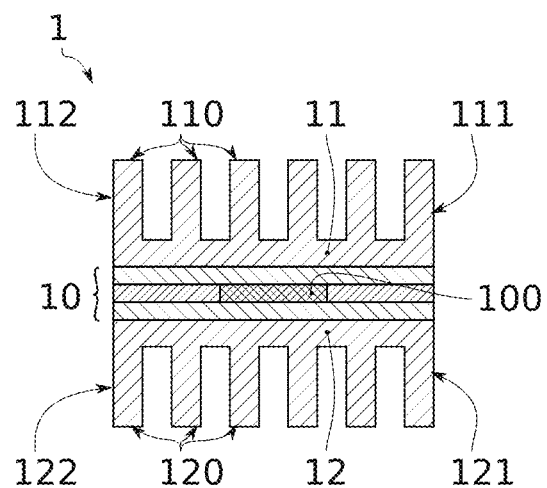
FIG. 1 shows a physical embodiment diagram of an elementary power electronic module according to the prior art.

The drawings are given by way of example and are not limiting of the invention. They constitute schematic principle representations intended to facilitate understanding of the invention and are not necessarily on the scale of practical applications.

In particular, the thicknesses and dimensions of the various layers and portions of the printed circuits, heat sinks and electrical connections illustrated are not representative of reality.

In the present patent application, the following notations are used:

For an elementary power electronic module X, it will be noted:
X0 the printed circuit of this module,
X1, X2 the first and second heat sinks of this module,
X10, X20 the central connection surfaces of the first and second heat sinks,
X11, X12 side connection surfaces of the first heat sink,
X21, X22 side connection surfaces of the second heat sink,
X00, X00A, X00B the electronic components of this module.

In the present patent application, a conductive electrical connection between a heat sink Xi (i=1, 2) of a first module X and a heat sink Yj (j=1, 2) of a second module Y, is denoted:
$XiYj_C$ In the present patent application, a capacitive electrical connection between a heat sink Xi (i=1, 2) of a first module X and a heat sink Yj (j=1, 2) of a second module Y, is denoted:
$XiYj_{CP}$ In the present patent application, an insulating electrical connection between a heat sink Xi (i=1, 2) of a first module X and a heat sink Yj (j=1, 2) of a second module Y, is denoted:
$XiYj_I$ The direction of connection on the sheet is read from left to right, bottom to top and front to back.

An electronic cell is denoted $C_n$.

All the references of each elementary power electronic module and/or of each electronic cell are not necessarily shown on the drawings for the sake of clarity. The references of the elements not explicitly referenced in the drawings can nevertheless be easily deduced from the notations explained above and from the detailed description which follows.

DETAILED DESCRIPTION

Before starting a detailed review of embodiments of the invention, it is recalled that the invention according to its first aspect comprises in particular the optional features below which can be used in combination or alternatively:

According to one embodiment, the electrical module connection between the first and second adjacent elementary modules further comprises one of a capacitive side electrical connection and an insulating side electrical connection between:
  at least another one of the anode and cathode side surfaces of the first elementary module, and
  at least another one of the anode and cathode side surfaces of the second elementary module.

According to one embodiment, at least one anode side surface of the first elementary module is connected to at least one cathode side surface of the second elementary module by a conductive side electrical connection and at least one cathode side surface of the first elementary module is connected to at least one anode side surface of the second elementary module by an electrical connection of a capacitive side electrical connection and an insulating side electrical connection.

According to one embodiment, the at least one power component of the first elementary module is one of a first power transistor and a first power diode, for example of the IGBT type, and the at least one power component of the second elementary module is one of a second power transistor and a second power diode, so that the electronic cell forms a switching cell.

According to one embodiment, the system comprises a plurality of adjacent electronic cells connected to each other, one electronic cell of the plurality of electronic cells being connected to at least one adjacent electronic cell by an electrical connection of cells, said electrical connection of cells comprising at least one of a conductive central electrical connection, a capacitive central electrical connection and a central insulating electrical connection between:
  at least one of the central anode and cathode surfaces of said cell, and
  at least one of the central anode and cathode surfaces of the at least one cell adjacent to said cell.

According to one embodiment, the electrical connection of cells comprises a conductive central electrical connection between:
  at least one of the central anode and cathode surfaces of said cell, and
  at least one of the central anode and cathode surfaces of at least one cell adjacent to said cell,
and one of a capacitive central electrical connection and a central insulating electrical connection between:
  at least another one of the central anode and cathode surfaces of the cell, and
  at least another one of the central anode and cathode surfaces of at least one cell adjacent to said cell.

According to one embodiment, at least one central cathode surface of the cell is connected to at least one central anode surface of the adjacent cell by a conductive central electrical connection and at least one central anode surface of the cell is connected to at least one central cathode surface of the adjacent cell by a central insulating electrical connection.

According to one embodiment, each electronic cell of the plurality of electronic cells is a switching cell, so that the system forms a sub-assembly of a multilevel power converter.

According to one embodiment, the electrical connection of cells further comprises at least one side conductive electrical connection between:
  at least one of the anode and cathode side surfaces of the cell, and
  at least one of the anode and cathode side surfaces of at least one other cell adjacent to said cell.

According to one embodiment, the system comprises a first electronic cell, a second electronic cell, a third electronic cell, a fourth electronic cell, said first, second, third, fourth electronic cells being switching cells, and:
  The central anode and cathode surfaces of the anode and cathode heat sinks connected to each other by a capacitive side electrical connection of the first cell are respectively connected to the central anode and cathode surfaces of the anode and cathode heat sinks connected to each other by a capacitive side electrical connection of the second cell, by conductive central electrical connections,
  The central anode and cathode surfaces of the anode and cathode heat sinks connected to each other by a capacitive side electrical connection of the third cell are respectively connected to the central anode and cathode surfaces of the anode and cathode heat sinks connected to each other by a capacitive side electrical connection of the fourth cell, by conductive central electrical connections,
  The anode and cathode side surfaces of the anode and cathode heat sinks connected to each other by a conductive side electrical connection, located on the same side of the first cell are respectively connected to the anode and cathode side surfaces of the anode and cathode heat sinks connected to each other by a conductive side electrical connection, located on the same side of the third cell, by insulating side electrical connections,
  The anode and cathode side surfaces of the anode and cathode heat sinks connected to each other by a capacitive side electrical connection, located on the same side of the first cell are respectively connected to the anode and cathode side surfaces of the anode and cathode heat sinks connected to each other by a capacitive side electrical connection, located on the same side of the third cell, by conductive side electrical connections,
  The anode and cathode side surfaces of the anode and cathode heat sinks connected to each other by a capacitive side electrical connection, located on the same side of the second cell are respectively connected to the anode and cathode side surfaces of the anode and cathode heat sinks connected to each other by a capacitive side electrical connection, located on the same side of the fourth cell, by conductive side electrical connections,
  The anode and cathode side surfaces of the anode and cathode heat sinks connected to each other by a conductive side electrical connection, located on the same side of the second cell are respectively connected to the anode and cathode side surfaces of the anode and cathode heat sinks connected to each other by a conductive side electrical connection, located on the same side of the fourth cell, by insulating side electrical connections, so that the system forms an interlaced chopper type power converter.

According to one embodiment, each heatsink comprises at least one of a fin, a pin and a finger.

According to one embodiment, at least one of the capacitive side electrical connection and the capacitive central electrical connection comprises at least one capacitor.

According to one embodiment, the system further comprises a cooling device, such as a ventilation or pumping device, configured to cool each anode and cathode heat sink.

According to one embodiment, the system further comprises at least one elementary inductance module comprising:

A conductive coil embedded in a magnetic matrix having a first face and a second face opposite the first face, a first electrically conductive heat sink on the first face and connected to said conductive coil, and a second electrically conductive heat sink on the second face and connected to said conductive coil.

According to one embodiment, the first heat sinks of the first and second adjacent elementary modules form one and the same first cell heat sink. The conductive side electrical connection between the first heat sinks of the first and second adjacent elementary modules therefore corresponds to an intermediate part of said first cell heat sink. This intermediate part may be located between a first part of said first cell heat sink, said first part being associated with the first elementary module, and a second part of said first cell heat sink, said second part being associated with the second elementary module. According to this embodiment, the conductive side electrical connection between the first heat sinks of the first and second adjacent elementary modules has material continuity with said first heat sinks, so that said conductive side electrical connection is inseparable from said first heat sinks.

According to one embodiment, the second heat sinks of the first and second adjacent elementary modules form one and the same second cell heat sink. The conductive side electrical connection between the second heat sinks of the first and second adjacent elementary modules therefore corresponds to an intermediate part of said second cell heat sink. This intermediate part may be located between a first part of said second cell heat sink, said first part being associated with the first elementary module, and a second part of said second cell heat sink, said second part being associated with the second elementary module. According to this embodiment, the conductive side electrical connection between the second heat sinks of the first and second adjacent elementary modules has material continuity with said second heat sinks, so that said conductive side electrical connection is inseparable from said second heat sinks.

According to one embodiment, the first heat sink of the first elementary module and the second heat sink of the second elementary module form one and the same main cell heat sink. The conductive side electrical connection between the first heat sink of the first elementary module and the second heat sink of the second elementary module therefore corresponds to an intermediate part of said main cell heat sink. This intermediate part may be located between a first part of said main cell heat sink, said first part being associated with the first elementary module, and a second part of said main cell heat sink, said second part being associated with the second elementary module. According to this embodiment, the conductive side electrical connection between the first heat sink of the first elementary module and the second heat sink of the second elementary module has material continuity with said first and second heat sinks, so that said conductive side electrical connection is inseparable from said first and second heat sinks.

According to one embodiment, the first printed circuit of the first elementary module and the second printed circuit of the second elementary module form one and the same main printed circuit. In this embodiment, the main printed circuit comprises first and second power components.

In the present invention, the first and second heat sinks are referred to as anode or cathode for the sake of clarity. This name is not restrictive of the invention. The anode and cathode heatsinks form electrodes. These electrodes can be an anode, a cathode, an emitter, a collector, a source, a drain, etc. These electrodes can be inverted according to the forward direction of the electronic component, for example.

In general, in the present invention, the anode heatsink preferably has a higher electrical potential than the cathode heatsink when the corresponding electronic switch is open (off state).

In the present invention, the term "IGBT-type transistor" means an Insulated Gate Bipolar Transistor.

Other transistor architectures can be used, for example but in a non-limiting manner:
 a "HEMT type transistor", which is a field effect transistor with high electron mobility, sometimes also designated by the term of heterostructure field effect transistor,
 an insulated gate field effect transistor more commonly called MOSFET (acronym for "Metal Oxide Semiconductor Field Effect Transistor").

Other components, such as thyristors, gate turn-off thyristors (GTO thyristor or more simply GTO, for "Gate Turn-Off" Thyristor), can also be used.

These transistors and components are well known and commonly used in the field of power electronics, in particular for static power converters.

In the field of power electronics, an electronic system means systems operating preferably with electric currents having currents comprised between 10 A and 1000 A, and/or electric voltages comprised between 10 V and 10000 V, preferably between 10 V and 5000 V, and preferably between 10 V and 1000 V.

The function of power converters is to convert an electrical signal into another electrical signal. For example, there are converters intended to convert an alternating current into another alternating current (AC/AC converters called dimmers), converters intended to convert a direct current into another direct current (DC/DC converters called choppers), converters intended to convert an alternating current into a direct current (AC/DC converters called rectifiers), and converters intended to convert a direct current into an alternating current (DC/AC converters called inverters).

The chopper is an electronic system in the field of power electronics implementing one or more controlled electronic switches. It allows in particular to modify the value of the average voltage of a direct voltage source with a high efficiency.

It is therefore connected on the one hand to a direct voltage source and on the other hand to one or more resistive or inductive loads. These connections are made at a half-bridge or bridge arm.

A chopper can consist of one or more bridge arms.

The bridge arm can be formed by one or more switching cells.

Each switching cell is formed by a pair of switches (controlled such as transistors and/or uncontrolled such as diodes) connected to each other.

By switching these switches, the chopper periodically changes the interconnection of the voltage source and the load.

The switching cell must comply with the fundamental rules for interconnection of the following sources:

A voltage source must not be short-circuited, but it can be opened.

A current source must not be open, but it can be short-circuited.

The state of the switches in the switching cell must therefore be complementary in order to comply with the interconnection rules.

To ensure this complementary switching, the switches can each be controlled by a control circuit or "gate driver".

The switching speed of these electronic switches can however be limited by parasitic inductances and/or parasitic capacitances of the electronic system. The switching frequency of the electronic system can therefore be limited.

According to the invention, the electronic system consists of several elementary modules each comprising power components providing in particular one or more electronic switch functions.

The system is therefore advantageously modular and allows to produce numerous structures of static converters, such as a switching cell, a multilevel converter, an interlaced chopper.

Figure 2A:
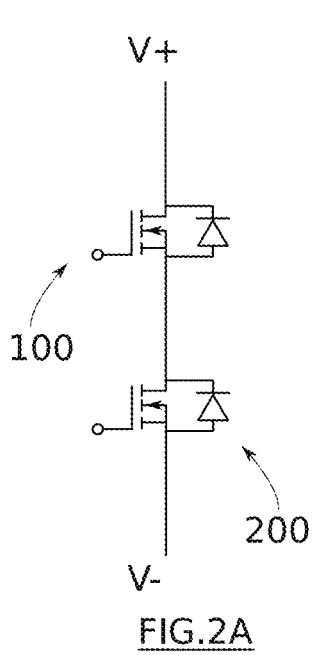
FIG. 2A shows an electronic diagram of an electronic cell comprising two power components in series.
Figure 2B:
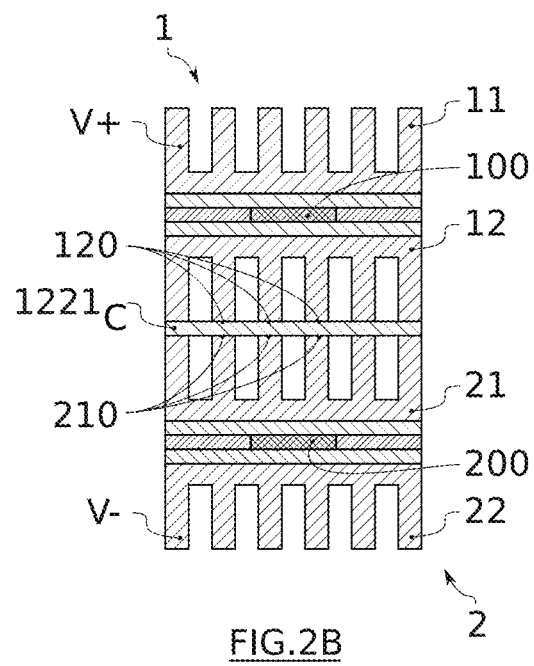
FIG. 2B shows a physical embodiment diagram of the electronic cell illustrated in FIG. 2A according to the prior art.
Figure 3A:
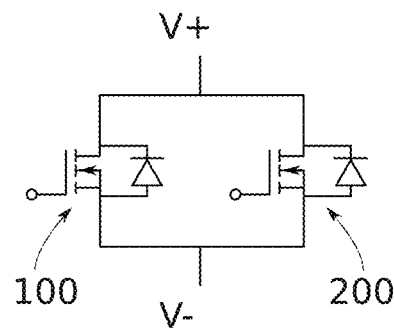
FIG. 3A shows an electronic diagram of an electronic cell comprising two power components in parallel.
Figure 3B:
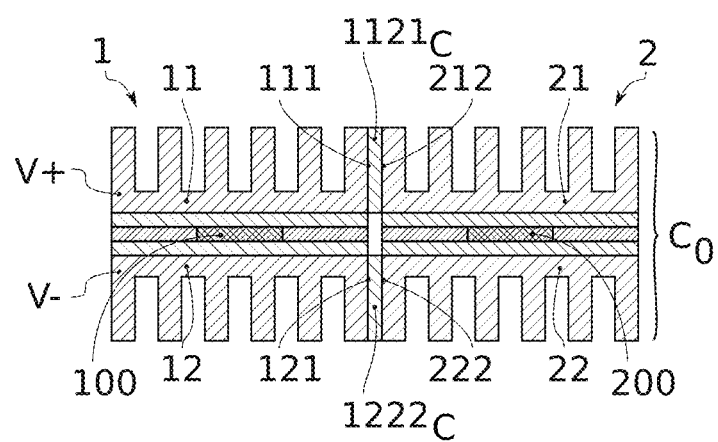
FIG. 3B shows a physical embodiment diagram of the electronic cell illustrated in FIG. 3A according to an embodiment of the present invention.

The principle of modularity of the electronic system according to the invention is illustrated in FIGS. 2B and 3B.

Each elementary module 1, 2 comprises at least one power component 100, 200 preferably integrated on a printed circuit 10, 20, a first heat sink 11, 21 and a second heat sink 12, 22.

The following description of an elementary module 1 as illustrated in FIG. 1 is valid for the other elementary modules of the electronic system according to the invention.

As illustrated in more detail in FIGS. 7A, 7B, the printed circuit 10, or PCB (from the acronym "Printed Circuit Board"), advantageously allows to provide connectors 101, 102, 103 for various semiconductor electronic components 100, 100A, 100B, such as transistors 100, 100A, diodes, control circuits 100B etc. It also allows to arrange these components by optimising the distribution of the electric field around these components. The integration of different components 100A, 100B on the same PCB 10 can allow good cooling of all of these components.

However, the use of a PCB 10 is not mandatory. Other carriers can be considered.

The printed circuit 10 preferably has a first face and a second face opposite the first face.

The first heat sink 11 is assembled at the first face of the integrated circuit 10, and the second heat sink 12 is assembled at the second face of the integrated circuit 10.

The assemblies of the first and second heatsinks 11, 12 on the first and second faces of the integrated circuit 10 can be produced by soldering, welding or by sintering.

Such assemblies advantageously allow to limit the thermal resistance of contact between the semiconductor component(s) 100, 100A, 100B of the PCB 10 and the heat sink(s) 11, 12.

Such assemblies do not require clamping pressure as required for a "press-pack" assembly.

They also allow to limit the number of thermal interfaces between the semiconductor component(s) of the PCB 10 and the heat sink(s) 11, 12. The efficiency of the heat dissipation is therefore improved.

The compactness of the module 1 can thus be optimised.

The first and second heatsinks 11, 12 are necessarily electrical conductors.

The first electrically conductive heat sink 11, called anode heatsink, is preferably connected to a first electrode, called anode, of the power component 100.

The second electrically conductive heat sink 12, called cathode heatsink, is preferably connected to a second electrode, called cathode, of the power component 100.

The first and second heatsinks 11, 12 can be made of aluminium in order to reduce the total weight of the elementary module 1.

Figure 9A:
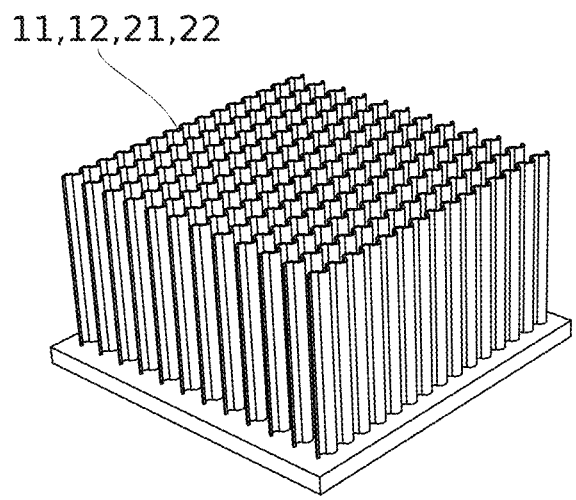
FIG. 9A shows a physical embodiment diagram of a heat sink according to an embodiment of the present invention.
Figure 9B:
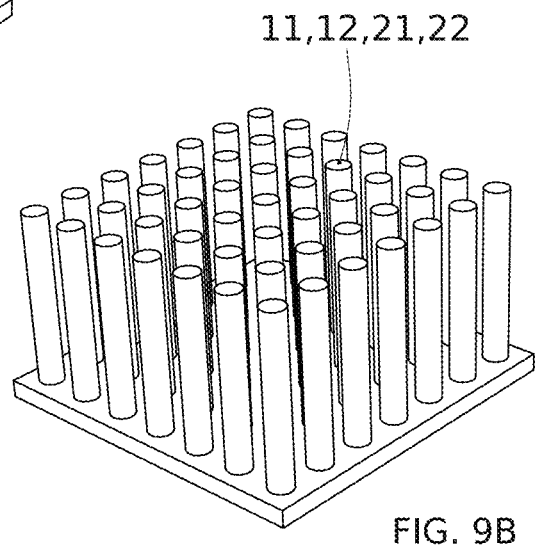
FIG. 9B shows a physical embodiment of a heat sink according to another embodiment of the present invention.

They may comprise flat or corrugated fins, as illustrated in FIG. 9A, or pins or fingers as shown in FIG. 9B, in order to improve heat transfers and optimise heat dissipation from power component(s) 100.

In the case of the fingers illustrated in FIG. 9B, the cooling fluid can advantageously flow in several directions. The installation of a fluid circulation device is therefore facilitated.

The cooling fluid can be air or an insulating liquid.

According to the invention, the heatsinks of an elementary module allow to ensure at least one electrical connection with the heatsinks of an adjacent elementary module of the electronic system.

Each heatsink preferably has a central connection surface and, for an elementary module of square or rectangular section in the plane of the integrated circuit, four side connection surfaces.

The electrical connection at these connection surfaces can be conductive, capacitive or insulating.

Insulating electrical connection means an electrically insulating or electrically insulated connection.

The conductive, capacitive or insulating electrical connection can be made respectively through a conductive, capacitive or insulating element. It can be done alternatively without an intermediate element, directly at the interface between the connection surfaces.

A conductive element $XiYj_C$, which is for example solid or in the form of a foam, can improve the electrical contact between the heatsinks if necessary.

Figure 10A:
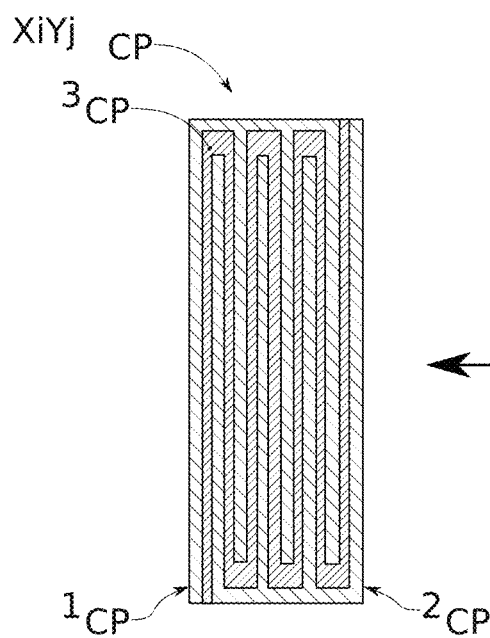
FIG. 10A shows a physical embodiment diagram of a capacitive side electrical connection according to an embodiment of the present invention.
Figure 10B:
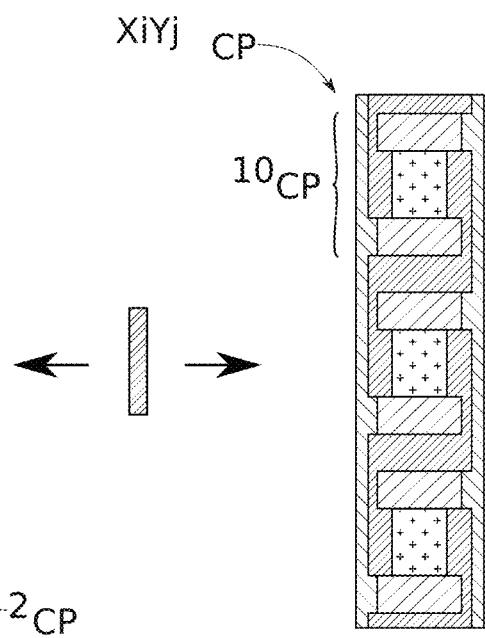
FIG. 10B shows a physical embodiment diagram of a capacitive side electrical connection according to another embodiment of the present invention.

A capacitive element $XiYj_{CP}$ as illustrated in FIGS. 10A, 10B is preferably used for the capacitive electrical connection. It can advantageously perform the function of a decoupling capacitor.

The area of such an element is preferably greater than or equal to the corresponding connection area of the heatsink, so as to obtain a relatively large capacitance value. The area can be comprised between 1 cm$^2$ and 10 cm$^2$. The capacitance can be comprised between 100 nF and 10 mF, preferably between 100 nF and 100 µF, preferably between 1 µF and 100 µF.

According to an example illustrated in FIG. 10A, the capacitive element can be formed by a planar capacitor comprising a first conductor $1cp$ and a second conductor $2cp$ separated by an insulating material $3cp$. This solution is simple and inexpensive.

According to another example illustrated in FIG. 10B, the capacitive element $XiYj_{CP}$ can be in the form of a PCB comprising several capacitors 10cp mounted in parallel. This advantageously allows to obtain a high value capacitance while largely limiting the Equivalent Series Inductance ESL of this capacitive element. The overvoltages induced during rapid switching of components can thus be advantageously limited.

The electrical connection can be central between two central connection surfaces of two adjacent elementary modules.

Alternatively or in combination, it can be lateral between two side connection surfaces of two adjacent elementary modules.

According to one example, two elementary modules 1, 2 can be assembled in series by a conductive central electrical connection 1221c between the cathode heatsink 12 of the first elementary module 1 and the anode heatsink 21 of the second elementary module 2, as illustrated in FIGS. 2A, 2B.

According to another example, two elementary modules 1, 2 can be assembled in parallel or in anti-parallel by conductive side electrical connections 1121c, 1222c respectively between the anode heatsinks 11, 21 of the first and second elementary modules 1, 2, and between the cathode heatsinks 12, 22 of the first and second elementary modules 1, 2, as illustrated in FIGS. 3A, 3B.

These various configurations of electrical connections between adjacent modules advantageously allow to produce numerous electronic systems.

The assembly of the elementary modules together can be achieved by maintaining mechanical contact between the different heatsinks involved in the electrical connections. This allows in particular to easily assemble/disassemble the electronic system for its maintenance or for its development by changing, adding or removing elementary modules comprising certain components.

The assembly can be carried out alternately by gluing or welding the different elementary modules together.

Figure 3C:
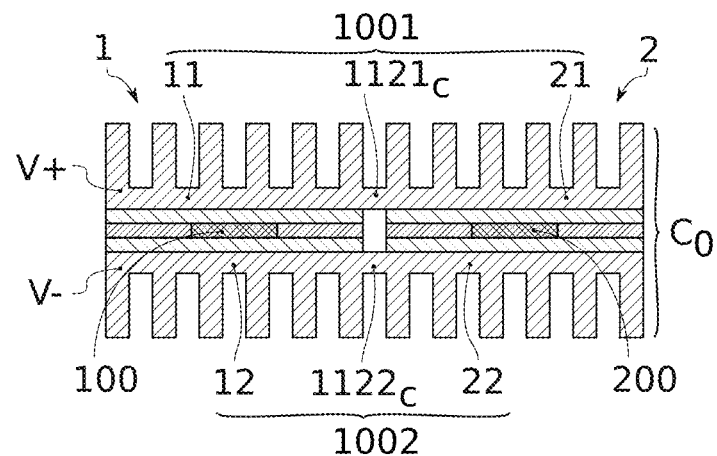
FIG. 3C shows a physical embodiment diagram of the electronic cell illustrated in FIG. 3A according to another embodiment of the present invention.

According to another example illustrated in FIG. 3C, the anode heatsinks 11, 21 of the first and second elementary modules 1, 2 form one and the same main anode heat sink 1001. The conductive side electrical connection 1121c here forms part of the main anode heat sink 1001. This main anode heat sink 1001 is thus continuous and/or made in one piece. It is shared between the first and second elementary modules 1, 2. In this example, the cathode heatsinks 12, 22 of the first and second elementary modules 1, 2 also form one and the same main cathode heat sink 1002. The conductive side electrical connection 1122c here forms part of the main cathode heat sink 1002. This main cathode heat sink 1002 is thus continuous and/or made in one piece. It is shared between the first and second elementary modules 1, 2.

Figure 3D:
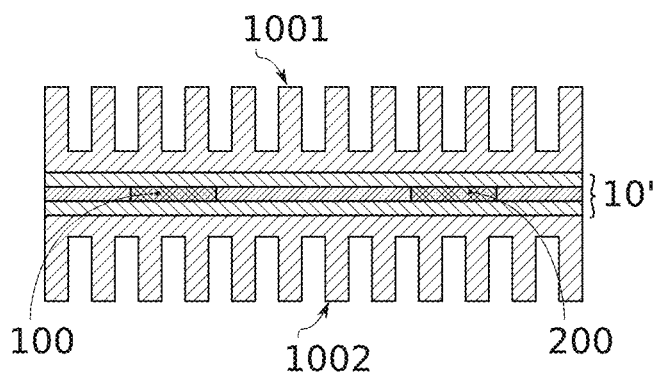
FIG. 3D shows a physical embodiment diagram of the electronic cell illustrated in FIG. 3A according to another embodiment of the present invention.

According to an example illustrated in FIG. 3D, the printed circuits 10, 20 of the first and second elementary modules 1, 2 form one and the same printed circuit 10'. The printed circuit 10' therefore comprises the first and second power components 100, 200. Such a printed circuit 10' is preferably associated with heatsinks 1001, 1002 extending on the faces of said printed circuit 10'.

According to one possibility not illustrated, a plurality of elementary modules assembled in parallel, for example three, four or more, can share one and the same main anode heat sink and/or one and the same main cathode heat sink. Likewise, one and the same printed circuit can comprise the power components of a plurality of elementary modules assembled together.

Figure 4A:
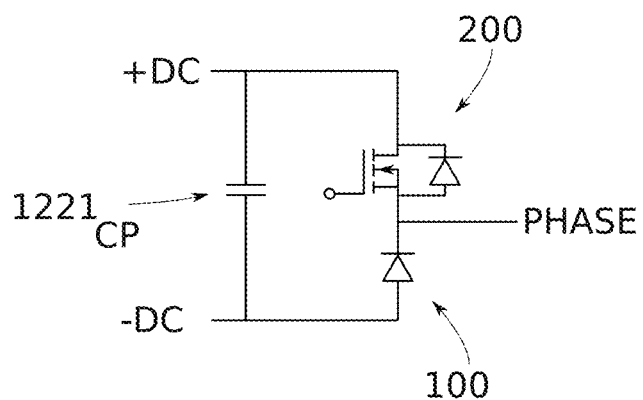
FIG. 4A shows an electronic diagram of a switching cell.
Figure 4B:
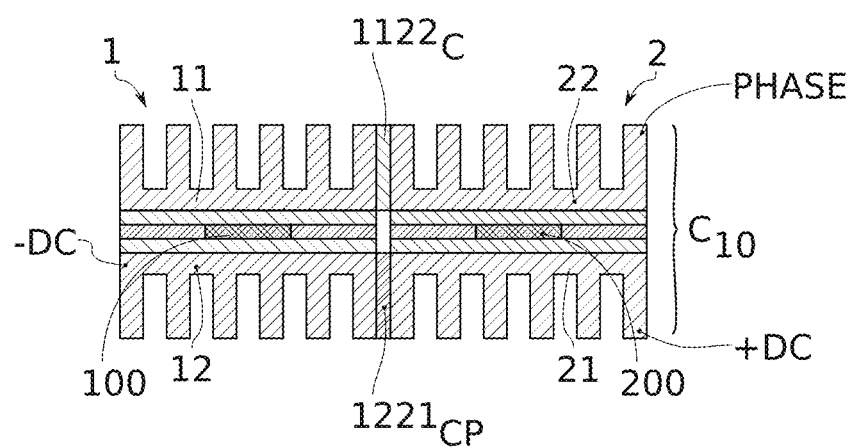
FIG. 4B shows a physical embodiment diagram of the switching cell illustrated in FIG. 4A according to an embodiment of the present invention.

According to a first embodiment of the invention illustrated in FIGS. 4A, 4B, the electronic system is a switching cell.

According to this embodiment, two elementary modules 1, 2 are preferably assembled by:
- a conductive side electrical connection 1122c between the anode heatsink 11 of the first elementary module 1 and the cathode heatsink 22 of the second elementary module 2, and
- a capacitive side electrical connection 1221cp between the cathode heatsink 12 of the first elementary module 1 and the anode heatsink 21 of the second elementary module 2. The capacitive side electrical connection 1221cp allows to integrate a decoupling capacitor within the switching cell so as to advantageously reduce parasitic inductances.

The power component 100 of the first module 1 can be a diode and the at least one power component 200 of the second module 2 can be a transistor associated with an anti-parallel diode for example, as illustrated in the electronic diagram in FIG. 4A.

The anti-parallel association of a diode and a transistor can be done directly within the same elementary module, for example integrated on the PCB, or by means of two separate elementary modules, one comprising the transistor and the other the diode, connected in anti-parallel.

According to one possibility, the power components 100, 200 of the first and second modules 1, 2 can be transistors, for example IGBT transistors, optionally each associated with an anti-parallel diode.

The +DC and −DC potentials associated with the voltage source and the phase potential associated with the midpoint output allowing the load to be power supplied are represented in the electronic diagram (FIG. 4A) and in the physical diagram (FIG. 4B) for clarity.

Figure 4C:
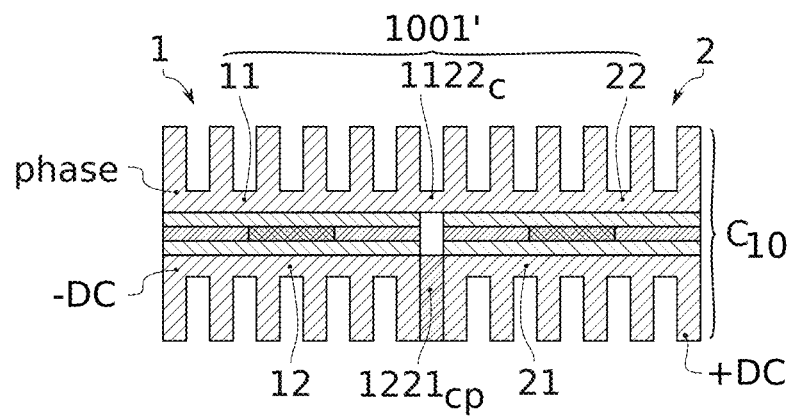
FIG. 4C shows a physical embodiment diagram of the switching cell illustrated in FIG. 4A according to another embodiment of the present invention.

According to an example illustrated in FIG. 4C, the anode heatsink 11 and the cathode heatsink 22 form one and the same heat sink 1001'. The conductive side electrical connection 1122c here forms part of the heat sink 1001'. This heat sink 1001' is thus continuous and/or made in one piece. It is shared between the first and second elementary modules 1, 2.

Figure 4D:
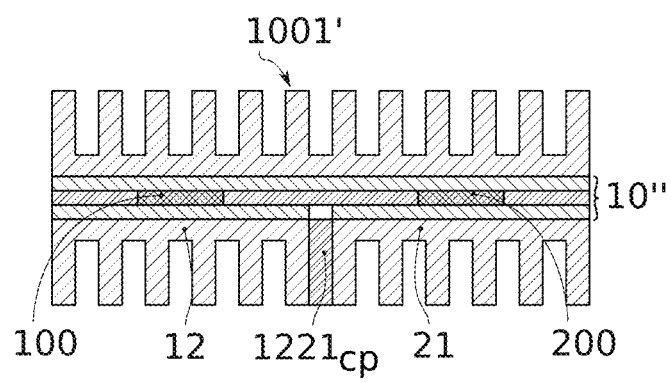
FIG. 4D shows a physical embodiment diagram of the switching cell illustrated in FIG. 4A according to another embodiment of the present invention.

According to an example illustrated in FIG. 4D, the printed circuits 10, 20 of the first and second elementary modules 1, 2 form one and the same printed circuit 10''. The printed circuit 10'' therefore comprises the first and second power components 100, 200. Such a printed circuit 10'' is preferably associated with the heatsink 1001' extending over a first face of said printed circuit 10''. A second face of the printed circuit 10'', opposite the first face, supports the cathode 12 and anode 21 heatsinks. This second face is preferably discontinuous at the capacitive side electrical connection 1221cp, so as not to short-circuit the cathode 12 and anode 21 heatsinks.

Figure 5A:
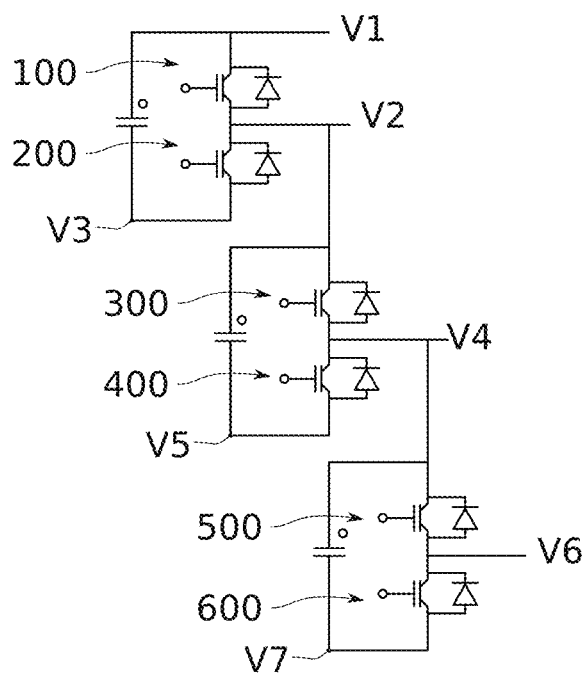
FIG. 5A shows an electronic diagram of part of an electronic multilevel conversion system corresponding to a series connection of switching cells.
Figure 5B:
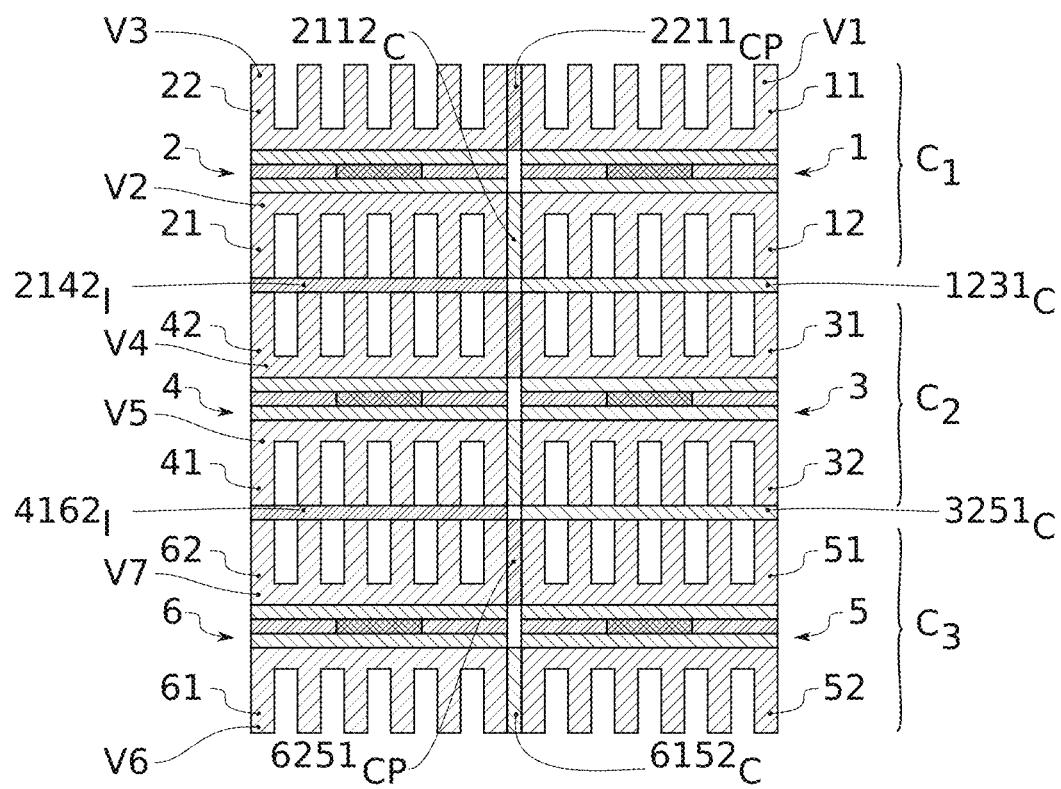
FIG. 5B shows a physical embodiment diagram of the part of the electronic multilevel conversion system illustrated in FIG. 5A according to an embodiment of the present invention.

According to a second embodiment of the invention illustrated in FIGS. 5A, 5B, the electronic system is a half-arm of a Multilevel Modular Converter MMC.

According to this embodiment, three switching cells C1, C2, C3 as described in the first embodiment are connected in series.

Preferably, each elementary module 1, 2, 3, 4, 5, 6 comprises an IGBT transistor associated with an anti-parallel diode, respectively forming the power components 100, 200, 300, 400, 500, 600 as illustrated in the electronic diagram in FIG. 5A.

Structurally, the first switching cell C1 comprising two elementary modules 1, 2 is connected to the second switching cell C2 comprising two elementary modules 3, 4, preferably by a conductive central electrical connection 1231c between the cathode heatsink 12 of the module 1 and the anode heatsink 31 of the module 3, and by a central insulating electrical connection 2142i between the anode heatsink 21 of the module 2 and the cathode heatsink 42 of the module 4.

The second switching cell C2 comprising two elementary modules 3, 4 is connected to the third switching cell C3 comprising two elementary modules 5, 6, preferably by a central electrically conductive connection 3251c between the cathode heatsink 32 of the module 3 and the anode heatsink 51 of the module 5, and by a central insulating electrical connection 4162i between the anode heatsink 41 of the module 4 and the cathode heatsink 62 of the module 6.

The potentials V1, V2, V3, V4, V5, V6, V7 associated with the different stages of the MMC are shown in the electronic diagram (FIG. 5A) and in the physical diagram (FIG. 5B) for the sake of clarity.

Figure 6A:
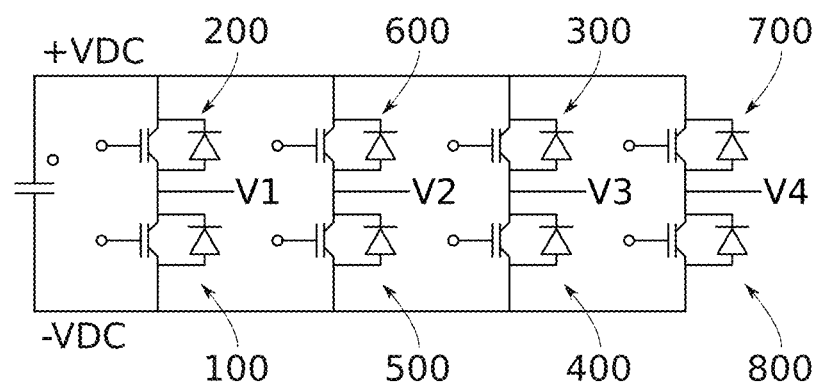
FIG. 6A shows an electronic diagram of an electronic power conversion system of the interlaced chopper type, corresponding to a placement of switching cells in parallel.
Figure 6B:
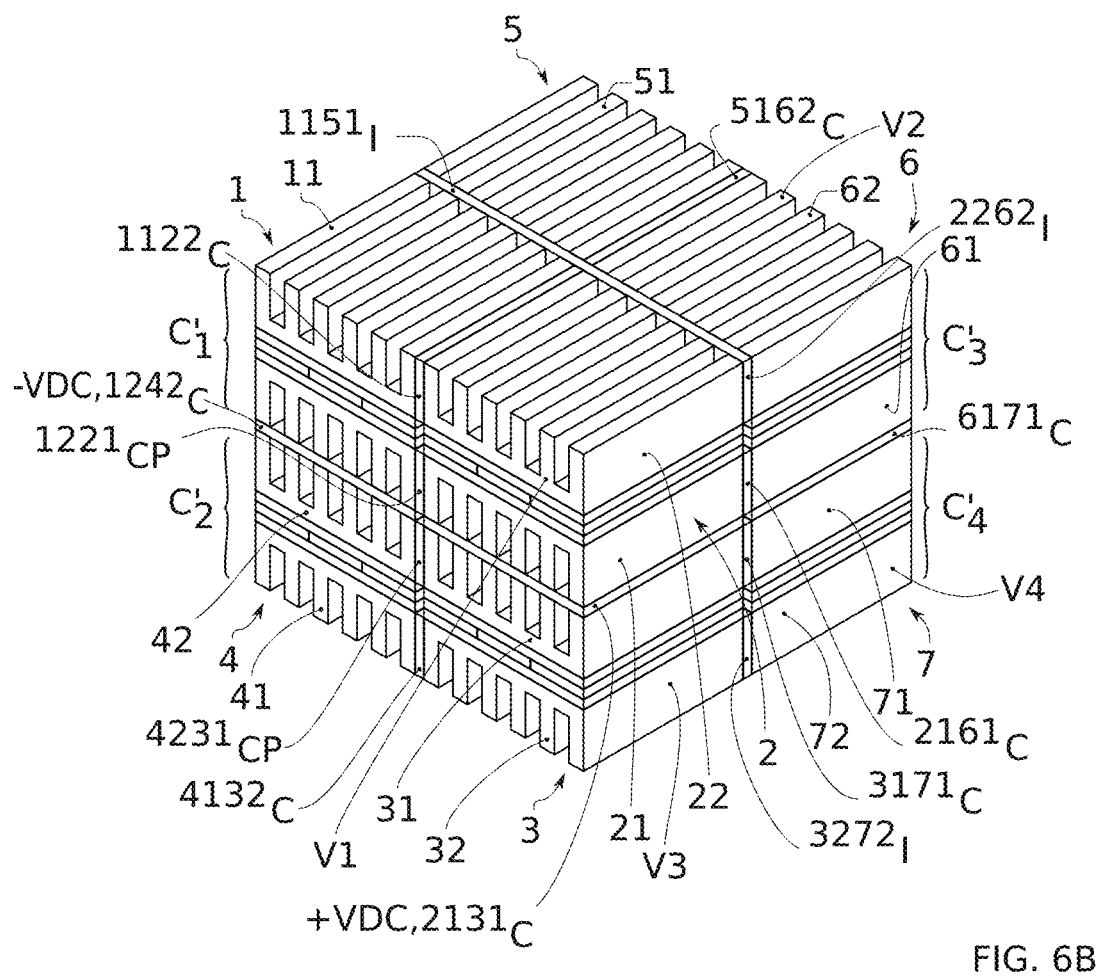
FIG. 6B shows a physical embodiment diagram of the power conversion electronic system of the interlaced chopper type illustrated in FIG. 6A according to an embodiment of the present invention.

According to a third embodiment of the invention illustrated in FIGS. 6A, 6B, the electronic system is an interlaced chopper with four bridge arms.

According to this embodiment, four switching cells C1', C2', C3', C4' as described in the first embodiment are connected in parallel.

Preferably, each elementary module 1, 2, 3, 4, 5, 6, 7, 8 comprises an IGBT transistor associated with an anti-parallel diode, respectively forming the power components 100, 200, 300, 400, 500, 600, 700, 800 as illustrated in the electronic diagram in FIG. 6A.

Such a structure can be achieved by combining central electrical connections and side electrical connections between switching cells C1', C2', C3', C4'.

The first switching cell C1' comprising two elementary modules 1, 2 is connected to the second switching cell C2' comprising two elementary modules 3, 4, preferably by a conductive central electrical connection 2131c between the anode heatsink 21 of the module 2 and the anode heatsink 31 of the module 3, and by a central electrically conductive connection 1242c between the cathode heatsink 12 of the module 1 and the cathode heatsink 42 of the module 4.

The third switching cell C3' comprising two elementary modules 5, 6 is connected to the fourth switching cell C4' comprising two elementary modules 7, 8, preferably by a central electrically conductive connection 5282c between the cathode heatsink 52 of the module 5 and the cathode heatsink 82 of the module 8, and by a central electrically conductive connection 6171c between the anode heatsink 61 of the module 6 and the anode heatsink 71 of the module 7.

The first switching cell C1' comprising two elementary modules 1, 2 is connected to the third switching cell C3' comprising two elementary modules 5, 6, preferably by:
  conductive side electrical connections 1252c, 2161c, respectively between the cathode heatsink 12 of the module 1 and the cathode heatsink 52 of the module 5, and between the anode heatsink 21 of the module 2 and the anode heatsink 61 of the module 6, and by,
  insulating side electrical connections 1151i, 2262i, respectively between the anode heatsink 11 of the module 1 and the anode heatsink 51 of the module 5, and between the cathode heatsink 22 of the module 2 and the cathode heatsink 62 of the module 6.

The second switching cell C2' comprising two elementary modules 3, 4 is connected to the fourth switching cell C4' comprising two elementary modules 7, 8, preferably by:
  conductive side electrical connections 3171c, 4282c, respectively between the anode heatsink 31 of the module 3 and the anode heatsink 71 of the module 7, and between the cathode heatsink 42 of the module 4 and the cathode heatsink 82 of the module 8, and by,
  insulating side electrical connections 3272i, 4181i, respectively between the cathode heatsink 32 of the module 3 and the cathode heatsink 72 of the module 7, and between the anode heatsink 41 of the module 4 and the anode heatsink 81 of the module 8.

The potentials V1, V2, V3, V4, associated with the various midpoint outputs of the arms of the chopper are shown in the electronic diagram (FIG. 6A) and in the physical diagram (FIG. 6B) for the sake of clarity.

This structure may comprise more than four switching cells, for example six, or less, for example three, to form an interlaced chopper comprising the desired number of arms.

For an odd number of switching cells, for example three, the latter can all be connected laterally to each other on the principle of side connections between C1' and C3' discussed above. Alternatively, central connections between all the cells are also possible. According to another possibility, a cell shares a side or central connection with two adjacent cells, for example by an offset positioning of said cell vis-à-vis the other two, or by one or more connection elements extending on the connection surfaces of the two considered adjacent cells.

According to one embodiment, the electronic system can comprise at least one elementary inductance module 9 as illustrated in FIG. 8B.

This elementary inductance module 9 can be made similarly to an elementary power module 1, in order to be easily integrated into the electronic system.

In particular, such an elementary inductance module 9 can comprise a conductive coil 900 embedded in a magnetic matrix 903.

A first electrically conductive heat sink 91 is preferably located on a first face of the magnetic matrix 903.

A second electrically conductive heat sink 92 is preferably located on a second face of the magnetic matrix 903 opposite the first face.

The first and second heat sinks 91, 92 are preferably connected to the conductive coil 900, for example by wire connections 901, 902.

As illustrated in FIG. 8A, such an elementary inductance module 9 can be advantageously connected to the midpoint output of a switching cell as described in the first embodiment of the invention.

The association of inductance modules 9 in series allows, for example, to increase the total inductance of the electronic system.

The association of inductance modules 9 in parallel allows, for example, to increase the maximum intensity of electric current admissible by the electronic system.

The electronic system according to the invention can thus comprise a plurality of elementary power modules and/or a plurality of elementary inductance modules connected to each other through their respective heat sinks.

This electronic system is preferably integrated in a housing 1000 and coupled to a cooling device 2000 as illustrated in FIGS. 11A, 11B.

A bus bar 3000 comprising input/output connections (not shown), also called a busbar, is preferably used for connecting the various modules 1, 2, 3 of the electronic system. Filter capacitors 3100, 3200 can complete the electronic system.

The cooling system 2000, for example a fan, is preferably sized to cool all the modules of the electronic system.

The thermal management of such a system is thus facilitated.

The circulation of the cooling fluid and, subsequently, the cooling efficiency are optimised.

The compactness of the system can thus be improved.

The overall mass of the system is also reduced.

FIG. 12 shows a thermal simulation within a component 100 of an elementary power module of the electronic system according to the invention. The heat sink 12 is visible in this FIG. 12. The assembly is cooled under a flow of air having a speed of 3.6 m/s.

The objective of this simulation is to size the module and/or the system so as to obtain cooling performance at least equivalent to that of a conventional system.

A conventional system marketed by Semikron comprises a P3/150 type heatsink associated with twelve components and an SKF 3-230-01 fan. The assembly has a mass of 3.1 kg, of which 0.55 kg is for the ventilator. For an air flow with a speed of 3.6 m/s generated by the fan, the thermal resistance per component is 1.7 K/W. The pressure drop is around 20 Pa.

The electronic system according to the invention sized to achieve this performance comprises a fan and twelve elementary modules each comprising a component and two straight-fin aluminium heatsinks.

Each heatsink has a square base 2 mm thick and 30 mm×30 mm in size. Each heatsink comprises twelve 1.4 mm wide and 15 mm high fins.

The thermal resistance per component obtained under these conditions is of the order of 1 K/W. The pressure drop is around 24 Pa.

The overall mass associated with this system is 1.2 kg (24 heatsinks of 26.2 g and 0.55 kg for the fan).

This electronic system is therefore approximately three times lighter than the conventional system and, according to this simulation, has better thermal performance than the conventional system.

Such an electronic system cooled by air and having an optimised mass can be advantageously used in the field of transport, in particular in aeronautics.

The invention is not limited to the embodiments described above and extends to all the embodiments covered by the claims.

The invention claimed is:

1. An electronic system comprising at least one electronic cell (C0), said at least one electronic cell (C0) comprising:
   a first elementary power electronic module (1), called first elementary module (1),
   a second elementary power electronic module (2), called second elementary module (2),
   said first and second elementary modules (1, 2) being adjacent and connected to each other by an electrical module connection,
   each of these first and second elementary modules (1, 2) comprising:
      at least one power component (100, 200),
      a first electrically conductive heat sink (11, 21), called anode heatsink, connected to a first electrode called anode of the power component (100, 200), and
      a second electrically conductive heat sink (12, 22), called cathode heatsink, connected to a second electrode called cathode of the power component (100, 200),
   wherein:
      each cathode heatsink (12, 22) has a first connection surface (120) called central cathode surface and at least one second connection surface (121, 122, 222) called cathode side surface, and
      each anode heatsink (11, 21) has a first connection surface (110, 210) called central anode surface and at least one second connection surface (111, 112, 212) called anode side surface, and in that:
      the electrical module connection between the first and second adjacent elementary modules (1, 2) comprises at least one conductive side electrical connection (1121c, 1222c) between:
         at least one of the anode and cathode side surfaces (111, 121) of the first elementary module (1), and
         at least one of the anode and cathode side surfaces (212, 222) of the second elementary module (2).

2. The system according to claim 1 wherein the electrical module connection between the first and second adjacent elementary modules (1, 2) further comprises one of a capacitive side electrical connection (1222cp) and an insulating side electrical connection (1221i) between:
   at least another one of the anode and cathode side surfaces (111, 121) of the first elementary module (1), and
   at least another one of the anode and cathode side surfaces (212, 222) of the second elementary module (2).

3. The system according to claim 2 wherein at least one anode side surface (111) of the first elementary module (1) is connected to at least one cathode side surface (222) of the second elementary module (2) by a conductive side electrical connection (1122c) and at least one cathode side surface (121) of the first elementary module (1) is connected to at least one anode side surface (212) of the second elementary module (2) by an electrical connection chosen from a capacitive side electrical connection (1221cp) or an insulating side electrical connection (1221i).

4. The system according to claim 3 wherein the at least one power component (100) of the first elementary module (1) is one of a first power transistor or a first power diode, and the at least one power component (200) of the second elementary module (2) is one of a second power transistor or a second power diode, so that the electronic cell forms a switching cell (C10).

5. The system according to claim 1 comprising a plurality of adjacent electronic cells connected to each other, one electronic cell (C1, C1') of the plurality of electronic cells being connected to at least one adjacent electronic cell (C2, C2') by an electrical connection of cells, said electrical connection of cells comprising at least one of a conductive central electrical connection (1231c, 1242c), a capacitive central electrical connection or a central insulating electrical connection (2142i) between:
   at least one of the central anode and cathode surfaces of the cell (C1, C1'), and
   at least one of the central anode and cathode surfaces of the at least one cell (C2, C2') adjacent to said cell (C1, C1').

6. The system according to claim 5, wherein at least one central cathode surface (120) of the cell (C1) is connected to at least one central anode surface (310) of the adjacent cell (C2) by a conductive central electrical connection (1231c) and at least one central anode surface (210) of the cell (C1) is connected to at least one central cathode surface (420) of the adjacent cell (C2) by a central insulating electrical connection (2142i).

7. The system according to claim 4 further comprising a plurality of adjacent electronic cells connected to each other, one electronic cell (C1, C1') of the plurality of electronic cells being connected to at least one adjacent electronic cell (C2, C2') by an electrical connection of cells, said electrical connection of cells comprising at least one of a conductive central electrical connection (1231c, 1242c), a capacitive central electrical connection or a central insulating electrical connection (2142i) between:
- at least one of the central anode and cathode surfaces of the cell (C1, C1'), and
- at least one of the central anode and cathode surfaces of the at least one cell (C2, C2') adjacent to said cell (C1, C1'), wherein at least one central cathode surface (120) of the cell (C1) is connected to at least one central anode surface (310) of the adjacent cell (C2) by a conductive central electrical connection (1231c) and at least one central anode surface (210) of the cell (C1) is connected to at least one central cathode surface (420) of the adjacent cell (C2) by a central insulating electrical connection (2142i), and wherein each electronic cell (C1, C2, C3) of the plurality of electronic cells is a switching cell (C10), so that the system forms a sub-assembly of a multilevel power converter.

8. The system according to claim 5 wherein the electrical connection of cells further comprises at least one side conductive electrical connection (1252c, 2161c) between:
- at least one of the anode and cathode side surfaces of the cell (C1'), and
- at least one of the anode and cathode side surfaces of at least one other cell (C3') adjacent to said cell (C1').

9. The system according to claim 8 wherein the electrical module connection between the first and second adjacent elementary modules (1, 2) further comprises one of a capacitive side electrical connection (1222cp) and an insulating side electrical connection (1221i) between:
- at least another one of the anode and cathode side surfaces (111, 121) of the first elementary module (1), and
- at least another one of the anode and cathode side surfaces (212, 222) of the second elementary module (2), and wherein at least one anode side surface (111) of the first elementary module (1) is connected to at least one cathode side surface (222) of the second elementary module (2) by a conductive side electrical connection (1122c) and at least one cathode side surface (121) of the first elementary module (1) is connected to at least one anode side surface (212) of the second elementary module (2) by an electrical connection chosen from a capacitive side electrical connection (1221cp) or an insulating side electrical connection (1221i), and wherein the at least one power component (100) of the first elementary module (1) is one of a first power transistor or a first power diode, and the at least one power component (200) of the second elementary module (2) is one of a second power transistor or a second power diode, so that the electronic cell forms a switching cell (C10), said system further comprising a first electronic cell (C1'), a second electronic cell (C2'), a third electronic cell (C3'), a fourth electronic cell (C4'), said first, second, third, fourth electronic cells (C1', C2', C3', C4') being switching cells (C10), wherein:

the central anode and cathode surfaces of the anode (21) and cathode (12) heat sinks connected to each other by a capacitive side electrical connection (1221cp) of the first cell (C1') correspondingly connected to the central anode and cathode surfaces of the anode (31) and cathode (42) heat sinks connected to each other by a capacitive side electrical connection (4231cp) of the second cell (C2'), by conductive central electrical connections (2131c, 1242c), the central anode and cathode surfaces of the anode (61) and cathode (52) heat sinks connected to each other by a capacitive side electrical connection (5261cp) of the third cell (C3') correspondingly connected to the central anode and cathode surfaces of the anode (71) and cathode (82) heat sinks connected to each other by a capacitive side electrical connection (8271cp) of the fourth cell (C4'), by conductive central electrical connections (6171c, 5282c), the anode and cathode side surfaces of the anode (11) and cathode (22) heat sinks connected to each other by a conductive side electrical connection (1122c), located on a same side of the first cell (C1') correspondingly connected to the anode and cathode side surfaces of the anode (51) and cathode (62) heat sinks connected to each other by a conductive side electrical connection (5162c), located on a same side of the third cell (C3'), by insulating side electrical connections (1151i, 2262i), the anode and cathode side surfaces of the anode (21) and cathode (12) heat sinks connected to each other by a capacitive side electrical connection (1221cp), located on a same side of the first cell (C1') correspondingly connected to the anode and cathode side surfaces of the anode (61) and cathode (52) heat sinks connected to each other by a capacitive side electrical connection (5261cp), located on a same side of the third cell (C3'), by conductive side electrical connections (2161c, 1252c), the anode and cathode side surfaces of the anode (31) and cathode (42) heat sinks connected to each other by a capacitive side electrical connection (4231cp), located on a same side of the second cell (C2') correspondingly connected to the anode and cathode side surfaces of the anode (71) and cathode (82) heat sinks connected to each other by a capacitive side electrical connection (8271cp), located on a same side of the fourth cell (C4'), by conductive side electrical connections (3171c, 4282c), the anode and cathode side surfaces of the anode (41) and cathode (32) heat sinks connected to each other by a conductive side electrical connection (4132c), located on a same side of the second cell (C2') correspondingly connected to the anode and cathode side surfaces of the anode (81) and cathode (72) heat sinks connected to each other by a conductive side electrical connection (8172c), located on a same side of the fourth cell (C4'), by insulating side electrical connections (4181i, 3272i), so that the system forms an interlaced chopper type power converter.

10. The system according to claim 1, wherein each heatsink (11, 12, 21, 22) comprises at least one of a fin or a finger.

11. The system according to claim 2 wherein at least one of the capacitive side electrical connection (1221cp, 2211cp, 6251cp, 4231cp) or the capacitive central electrical connection comprises at least one capacitor (10cp).

12. The system according to claim 1 further comprising a cooling device (2000) configured to cool each anode and cathode heat sink (11, 12, 21, 22).

13. The system according to claim 1 further comprising at least one elementary inductance module (9) comprising:
- a conductive coil (900) embedded in a magnetic matrix (903) having a first face and a second face opposite the first face,
- a first electrically conductive heat sink (91) on the first face and connected to said conductive coil (900), and
- a second electrically conductive heat sink (92) on the second face and connected to said conductive coil (900).

* * * * *